United States Patent [19]

Cupta et al.

[11] Patent Number: 4,718,993

[45] Date of Patent: Jan. 12, 1988

[54] PROCESS FOR PREPARING THE THROUGH HOLE WALLS OF A PRINTED WIRING BOARD FOR ELECTROPLATING

[75] Inventors: Glenn W. Cupta, Clifton; Anthony M. Piano, Lodi, both of N.J.

[73] Assignee: Olin Hunt Specialty Products Inc., Palisades Park, N.J.

[21] Appl. No.: 55,562

[22] Filed: May 29, 1987

[51] Int. Cl.$^4$ ............................ C25D 5/02; C25D 5/54
[52] U.S. Cl. ............................................ 204/15; 204/20; 204/26
[58] Field of Search .................... 204/15, 20, 26, 38.4

[56] References Cited

U.S. PATENT DOCUMENTS

| | | | |
|---|---|---|---|
| 409,096 | 8/1889 | Blank | 204/29 |
| 1,037,469 | 9/1912 | Goldberg | 427/123 |
| 1,352,331 | 9/1920 | Unno | 204/31 |
| 2,243,429 | 5/1941 | Laux | 204/30 |
| 2,947,064 | 8/1960 | Langton | 29/852 |
| 3,003,975 | 10/1961 | Louis | 252/503 |
| 3,014,818 | 12/1961 | Campbell | 428/549 |
| 3,099,608 | 7/1963 | Rodovsky et al. | 204/15 |
| 3,163,588 | 12/1964 | Shortt et al. | 204/16 |
| 3,249,559 | 5/1966 | Gallas | 252/510 |
| 3,696,054 | 10/1972 | Saunders | 252/511 |
| 3,799,802 | 3/1974 | Schneble, Jr. et al. | 204/29 |
| 3,910,852 | 10/1975 | Lederman et al. | 252/512 |
| 3,941,584 | 3/1976 | Tundermann et al. | 106/290 |
| 4,035,265 | 7/1977 | Saunders | 252/510 |
| 4,090,984 | 5/1978 | Lin et al. | 252/511 |
| 4,239,794 | 12/1980 | Allard | 428/219 |
| 4,305,847 | 12/1981 | Stoetzer et al. | 252/512 |
| 4,389,268 | 6/1983 | Oshima et al. | 156/150 |
| 4,478,882 | 10/1984 | Roberto | 427/97 |
| 4,581,301 | 4/1986 | Michaelson | 428/551 |
| 4,619,741 | 10/1986 | Minten et al. | 204/15 |
| 4,622,107 | 11/1986 | Piano | 204/15 |
| 4,622,108 | 11/1986 | Polakovic et al. | 204/15 |
| 4,631,117 | 12/1986 | Minten et al. | 204/15 |

Primary Examiner—T. M. Tufariello
Attorney, Agent, or Firm—William A. Simons; Thomas P. O'Day

[57] ABSTRACT

An improvement to the process for electroplating the walls of through holes in a laminated printed wiring board which comprises:

(a) contacting said printed wiring board with an aqueous alkaline silicate solution, followed by;
(b) contacting said printed wiring board with a dispersion of carbon black comprising:
  (1) carbon black particles having an average particle diameter of less than about 3.0 microns in said dispersion;
  (2) an effective dispersing amount of a surfactant which is compatible with said carbon black; and
  (3) liquid dispersing medium, wherein the amount of carbon black is sufficient to coat substantially all of the non-conducting portions of said through hole walls and is less than about 4% by weight of said liquid dispersion; then
(c) separating substantially all of said liquid dispersing medium from said carbon black particles, whereby said particles are deposited on said non-conductive portions of the through hole walls in a substantially continuous layer; and
(d) electroplating a substantially continuous conductive metal layer over the deposited carbon black layer and said non-conductive surface, thereby electrically connecting said metal layers of said printed wiring board.

28 Claims, No Drawings

PROCESS FOR PREPARING THE THROUGH HOLE WALLS OF A PRINTED WIRING BOARD FOR ELECTROPLATING

BACKGROUND OF THE INVENTION

1. Field of the Invention

This invention relates to an improved process for preparing the through hole walls of a printed wiring board (PWB) for electroplating.

2. Description of Related Art

For the past quarter century the printed wiring board industry has relied on the electroless copper deposition process to prepare through hole walls in printed wiring boards for electroplating. These plated through hole walls are necessary to achieve connections between two metal circuit patterns on each side of a printed wiring board or, in addition to this, between the inner layer circuit patterns of a multilayer board.

The electroless deposition of copper onto the through hole walls typically consists of precleaning a PWB and then processing according to the following flow diagram:

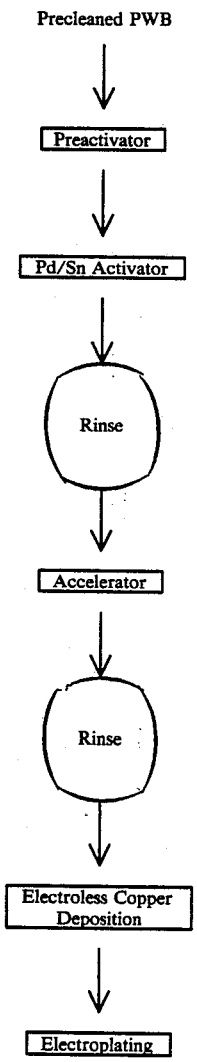

These processed boards may also be photoimaged before the electroplating process. Typically, the deposited copper layer on each through hole wall is about 1±0.2 mil thick.

Conventional electroless processes have several commercial disadvantages. They require a relatively long process time. The multiple treatment baths have complex chemistry which may require constant monitoring and individual ingredients which may require separate replenishment. The palladium/tin activator also may require expensive waste treatment. Furthermore, these electroless process baths may be very sensitive to contamination. Finally, the multiplicity of rinse baths may require large amounts of water.

Prior to the electroless method of plating through holes, graphite was employed to prepare the walls of the through holes for plating. For example, U.S. Pat. No. 3,099,608, which issued to Radovsky et al on July 30, 1963, teaches a process for preparing the through hole walls of printed circuit boards for electroplating by initially depositing in said through holes a thin electrically non-conductive film of palladium metal in at least a semi-colloidal form. The patent discloses that graphite had been used previously as a conductive layer for electroplating thereon. See column 1, lines 63–70 and column 4, line 72 to column 5, line 11. These patentees noted several deficiencies with that graphite process including lack of control of the graphite application, poor deposit of the resultant electroplated metal, non-uniform through hole diameters, and low electrical resistance of the graphite.

U.S. Pat. No. 3,163,588, which issued to Shortt et al on Dec. 29, 1964, also mentions that graphite or its equivalents may be employed to render through hole walls of electric circuit boards conductive for later electroplating metals thereon. See column 3, line 45 to column 4, line 2.

U.S. Pat. No. 4,581,301, which issued to Michaelson on Apr. 8, 1986, teaches the application of a seed layer of conductive particles, such as "carbon", on the walls of through holes before electrolytically plating copper over the seed layer. This reference does not explicitly teach the use of a continuous layer of surfactant or carbon black in the seed layer, and does not recognize the advantage of using very small particles of carbon black such as presently claimed. See column 7, lines 63–66 which refer to particles passing through a 400 mesh screen. A 400 mesh screen is equivalent to about 35 microns.

Separately, graphite has been employed in numerous processes for preparing a non-conducting material for a metal coating or plating. For example, U.S. Pat. No. 409,096, which issued to Alois Blank on Aug. 13, 1889, teaches a process for applying copper to asbestos roofing material which comprises first applying powdered plumbago (graphite) in a volatile liquid such as varnish to the surface of the asbestos, then evaporating the volatile liquid to coat the asbestos fibers with fine particles of plumbago. The plumbago coated asbestos sheets are then immersed in a copper electroplating solution and electric current is applied to the coated asbestos sheet to form a thin film of copper thereon. The copper coated sheet is then immersed in a bath of molten metal such as tin, lead, or zinc, and is then removed from the molten bath to effect solidification of the molten metal. The resulting metal coated asbestos sheet is described as being relatively flexible, a non-conductor of heat and substantially fireproof.

U.S. Pat. No. 1,037,469, which issued to Goldberg on Sept. 3, 1912, and U.S. Pat. No. 1,352,331, which issued to Unno on Sept. 7, 1920, disclose processes for electroplating non-conducting materials by first coating the non-conducting material with wax, then coating the wax with a slurry of finely divided particles of graphite or other metal, followed by electroplating of the dust-coated surface with copper or other metal. Neither of these processes are particularly suitable for use in coating the hole walls of circuit boards because the holes are normally extremely narrow in diameter and immersing in wax would tend to plug the hole and prevent coating the hole walls with an electroplating material.

U.S. Pat. No. 2,243,429, which issued to Laux on May 27, 1941, discloses a process for electroplating a non-conductive surface by "graphiting" a thin layer onto the non-conducting surface followed by applying a copper layer electrolytically and "finally a further electrolytic deposit of another metal" is placed thereon.

Separately, carbon black formulations have been employed as conductive coatings for non-conductive materials. For example, U.S. Pat. No. 4,035,265, which issued to Saunders on July 12, 1977, discloses conductive paint compositions containing both graphite and carbon black along with air-hardenable binder. These paints are suitable for application to the walls of a building for use as a heating element.

U.S. Pat. No. 4,090,984, which issued to Lin et al on May 23, 1978, teaches a semi-conductive coating for glass fibers comprising (a) a polyacrylate emulsion; (b) electrically conductive carbon black dispersion and (c) a thixotropic gelling agent. The conductive carbon black dispersions employed are those comprising electrically conductive carbon black dispersed in from about 3 to about 4 percent by weight of a suitable dispersing agent.

U.S. Pat. No. 4,239,794, which issued to Allard on Dec. 16, 1980, teaches dispersing a conductive carbon black in a latex binder with a selected dispersing agent, then impregnating this carbon black dispersion into a non-woven fibrous web followed by drying any residual water, leaving a thin coating of carbon black dispersed on the surfaces of said fibers.

U.S. Pat. No. 4,619,741, which issued to Karl L. Minten and Galina Pismennaya on Oct. 28, 1986, teaches a process of electroplating the through holes of a PWB which is a significant improvement over the known electroless techniques. By this process, a liquid dispersion of carbon black particles is first applied to the non-conductive portions of the through holes; then the liquid dispersion medium is separated (i.e. evaporated) from the carbon black particles, thereby depositing a substantially continuous layer of carbon black particles on the non-conductive surfaces of the through holes; and next a substantially continuous metal layer is electroplated over the deposited carbon black layer. This process of Minten and Pismennaya has several advantages over the known electroless techniques including the elimination of the preactivator, the Fd/Sn activator and the accelerator; less possibility of pollution problems; better bath stability; and fewer possible side reactions. This disclosure of the above-mentioned U.S. Patent of Minten and Pismennaya is incorporated herein by reference in its entirety.

While this Minten and Pismennaya patented process in itself teaches an effective means for electroplating through holes of printed wiring board, there is still a need to improve the overall quality (i.e. achieve a void-free copper deposit) for all types of printed wiring boards, especially multilayer boards.

Improvements and modifications of this Minten and Pismennaya process are shown in U.S. Pat. Nos. 4,622,107 (Piano); 4,622,108 (Polakovic and Piano) and 4,631,117 (Minten, Battisti and Pismennaya). The first of these patents teaches the use of a gas-forming compound (e.g. sodium carbonate) to remove loose or easily removable carbon black particles in the through holes. The second of these patents teaches the contacting of an alkaline hydroxide pre-conditioning solution to the through hole walls before application of the carbon black dispersion so that the carbon black dispersion will have better adhesion to the walls. The third listed patent teaches the use of this carbon black dispersion as a pre-activator for electroless plating of the through holes. These three U.S. patents are incorporated herein by reference in their entireties.

It is a primary object of this invention is to provide an improved electroplating process for applying a conductive metal layer to the through hole walls of printed wiring boards over the process disclosed in the above-noted Minten and Pismennaya patent.

It is another object of this invention to provide an even more economical process for applying a conductive metal layer to the surfaces of non-conducting layers of printed wiring boards than presently known electroless processes.

BRIEF DESCRIPTION OF THE INVENTION

Accordingly, the present invention accomplishes the foregoing objects by providing an improvement to the process for electroplating the walls of through holes in a laminated printed wiring board comprised of at least one non-conductive layer laminated to at least two separate conductive metal layers, which comprise the (a) contacting said printed wiring board with an aqueous alkaline silicate solution followed by;
(b) contacting said printed wiring board having said through holes with a dispersion of carbon black comprising:
  (1) carbon black particles having an average particle size of less than about 3.0 microns in said dispersion;
  (2) an effective dispersing amount of a surfactant which is compatible with said carbon black; and
  (3) a liquid dispersing medium, wherein the amount of carbon black is sufficient to coat substantially all of the non-conducting portions of said through hole walls and is less than about 4% by weight of said liquid dispersion; then
(c) separating substantially all of the liquid dispersing medium from said dispersion, thereby depositing said carbon black particles in a substantially continuous layer on said non-conducting portions of said hole walls; and
(d) electroplating a substantially continuous metal layer over the deposited carbon black layer on said non-conducting portions of hole walls, thereby electrically connecting said metal layers of said printed wiring board.

These printed wiring boards are usually comprised of an epoxy resin/glass fiber mixture positioned between two conductive metal layers (e.g. copper or nickel plates or foils) or a multiplicity of said alternating layers. Applying a conducting metal layer over said non-conducting portions of said through hole walls electrically connects the conductive metal layers.

Still further, the present invention also encompasses the resulting printed wiring boards prepared by the above-noted process (i.e. those having their through hole walls contacted with the aqueous alkaline silicate solution followed by the carbon black and surfactant deposit either alone or with the metal plating thereover).

DESCRIPTION OF THE PREFERRED EMBODIMENTS

The present invention is directed towards an improvement to the above-noted Minten and Pismennaya process for preparing the through hole walls of a printed wiring board for the application of an electroplated layer of copper over a non-conducting layer separating two plates or foils of copper. The preparation process of the present invention entails the employment of an aqueous alkaline silicate solution over the non-conducting portions of the through hole walls before application of the carbon black dispersion and before electroplating.

Printed wiring boards (also known as printed circuit boards) are generally laminated materials comprised of two or more plates or foils of copper, which are separated from each other by a layer of non-conducting material. Although copper is generally used as the electroplating metal in printed wiring boards, those skilled in the art will recognize that other metals such as nickel, gold, palladium, silver and the like can also be electroplated by the process of this invention. The non-conducting layer or layers are preferably an organic material such as an epoxy resin impregnated with glass fiber particles. However, the non-conducting layer may also be comprised of thermosetting resins, thermoplastic resins, and mixtures thereof, with or without reinforcing materials such as fiberglass and fillers.

Suitable thermoplastic resins include the acetal resins; acrylics, such as methyl acrylate; cellulosic resins, such as ethyl cellulose, cellulose acetate, cellulose propionate, cellulose acetate butyrate, cellulose nitrate, and the like; chlorinated polyethers; nylon, polyethylene; polypropylene, polystyrene; styrene blends, such as acrylonitrile styrene co-polymers and acrylonitrile-butadiene-styrene (ABS) co-polymers; polycarbonates; polychlorotrifluoroethylene; and vinyl polymers and co-polymers, such as vinyl acetate, vinyl alcohol, vinyl butyral, vinyl chloride, vinyl chloride-acetate co-polymer, vinylidene chloride and vinyl formal.

Suitable thermosetting resins include alkyl phthalate, furane; melamine-formaldehyde; phenol formaldehyde and phenol-furfural co-polymer; alone or compounded with butadiene acrylonitrile co-polymer or acrylonitrile-butadiene-styrene (ABS) co-polymers; polyacrylic esters; silicones; urea formaldehydes; epoxy resins, polyimides, alkyl resins, glyceryl phthalates; polyesters; and the like.

In many printed wiring board designs, the electrical pathway or pattern requires a connection between the separated copper plates at certain points in the pattern. This is usually accomplished by drilling holes at the desired locations through the laminate of copper plates and the non-conducting layer and then connecting the separate metal plates. The hole diameters of printed wiring boards generally range from between about 0.5 and about 10 millimeters in diameter, and preferably from about 1 to about 5 millimeters.

After drilling these through holes, it may be desirable to deburr the holes to make the hole walls relatively smooth. In the case of multilayer printed wiring boards, it may also be desirable to subject the boards to a desmear or etchback operations to clean the inner copper interfacing surfaces of the through holes. Suitable preparative operations include any or all of the presently available conventional operations.

Once the surfaces of through holes have been made relatively smooth for plating, these walls are contacted with an aqueous alkaline silicate solution. The preferred alkaline silicate is potassium silicate, although other alkali metal and alkaline earth metal silicates may be used. Dilute aqueous solutions of alkaline silicate may be employed; amounts from about 0.5 to about 2.0% by weight of the alkaline silicate in water are preferred. The alkaline silicate is preferably made in situ by adding together an alkaline hydroxide and silica into water. A molar excess of the alkaline hydroxide (e.g. KOH) is preferably used to make sure that substantially all of the silica is dissolved and reacted. The alkaline silicate-containing solution is preferably from about 20° C. to about 70° C. during the contacting step.

The preferred type of silica is fumed silica. One suitable fumed silica is in the form of super dense particles and is sold commercially under the trademark CAB-O-SIL MS-7SD by the Cabot Corporation. However, other fumed silica of suitable bulk density and particle size may be employed. The bulk density of suitable fumed silica is generally in the range of between about 5 to about 10 pounds per cubic foot. The desired particle size diameter of the fumed silica is generally in a range of between about 0.005 and about 0.025, and more preferably in the range of between about 0.01 and about 0.015 microns.

This aqueous alkaline silica solution is contacted to the through holes of the PWB by any conventional means. Spraying, dipping and the like are preferred methods of contacting. Dipping the PWB into a room temperature bath for about 1 to 10 minutes is preferred. The employment of this aqueous alkaline silicate solution before the carbon black dispersion allows for better adhesion of the carbon black particles to the hole walls; especially to the epoxy and glass portions of the walls. In turn, when the carbon black particles better adhere to the wall surfaces, the overlying electroplated copper layer will have better adhesion. The exact reasons for the improved results are not yet fully understood.

In one preferred embodiment of this invention, the contacting with aqueous alkaline silicate solution is preceded by, or employed together with, contacting the PWB with an aqueous alkaline cleaner solution. The preferred method of contacting with a cleaner solution is dipping the PWB into a heated (e.g. 130°-170° F.) aqueous cleaner solution bath for about 1-10 minutes. This cleaner solution is used to remove grease and other impurities from the hole wall surfaces. These cleaner solutions are customarily used in electroless processing for the same reasons. One preferred cleaner is "Cleaner 102" available from Olin Hunt Specialty Products, Inc. of West Paterson, N.J. This cleaner formulation contains monoethanolamine, a nonionic surfactant and ethylene glycol. Another preferred cleaner is "Cleaner 101" available from Olin Hunt Specialty Products, Inc. of West Paterson, N.J. This cleaner formulation contains sodium hydroxide, an anionic surfactant and various builders. The preferred total concentration of cleaner ingredients in the bath water is from about 1% to about 10% by weight.

If the cleaner solution precedes the aqueous alkaline silicate solution, it is preferred to rinse the treated board in a water rinse bath between operations. Alternatively, these solutions may be combined into one treatment. A water rinse treatment (e.g. bath) is commonly used after the silicate treatment to prevent a carry over of the silicate chemistry into the following treatments.

After the contacting step with the above-noted aqueous alkaline silicate solution, one preferred embodiment of the present invention is to contact the treated PWB with an aqueous conditioner solution. The preferred method of contacting with a conditioner is dipping the silicate treated PWB into a room temperature aqueous conditioner bath for about 1-10 minutes. This conditioner solution is used to ensure that substantially all of the hole wall glass/epoxy surfaces are properly prepared to accept a continuous layer of the subsequent carbon black particles. Such conditioner solutions have been customarily used in electroless processing to precondition the boards for the electroless chemistry. See U.S. Pat. No. 4,634,691, which issued to Lindsey on Jan. 6, 1987, for a discussion of conditioner solution. This Lindsey patent is incorporated herein by reference in its entirety. One preferred conditioner is "Conditioner 102" available from Olin Hunt Specialty Products, Inc. of West Paterson, N.J. This conditioner formulation comprises the mixture of monoethanolamine and a polyamine resin in water. Another preferred conditioner is "Conditioner 103" available from Olin Hunt Specialty Products, Inc. of West Paterson, N.J. This conditioner comprises the mixture of stearamidopropyl-dimethylhydroxy-ethylammoniumdihydrogen phosphate with triethanolamine in water. The preferred concentration of total conditioner ingredients in water is from about 1% to about 10% by weight.

While it is more preferred to employ the aqueous alkaline silicate solution before the conditioner solution, it may be advantageous in some operations to have the silicate solution subsequent to the conditioner solution. See Example 4 below. In any event, a water rinse operation (e.g. bath) is employed after each PWB treatment operation to prevent carry over of the chemicals of one treatment bath into the next treatment bath.

The liquid carbon black dispersion is next applied to or contacted with the silicate treated PWB. This dispersion contains three critical ingredients, namely, carbon black, one or more surfactants capable of dispersing the carbon black and a liquid dispersing medium such as water. The preferred method of applying the dispersion to the PWB include immersion, spraying or other methods of applying chemicals used in the PWB industry. A single working bath is sufficient for applying this carbon black dispersion; however, more than one bath may be used for rework or other purposes.

In preparing this liquid dispersion, the three critical ingredients and any other preferred ingredients are thoroughly mixed together to form a stable dispersion. This may be accomplished by subjecting a concentrated form of the dispersion to ball milling, colloidal milling, high-shear milling or ultrasonic techniques. The thoroughly mixed dispersion is later diluted with more water while agitating to the desired concentration for the working bath. The preferred method of mixing is ball milling a concentrated form of the dispersion in a container having glass mineral or plastic beads therein for a period of about 1 to about 24 hours. This thorough mixing allows for the carbon black particles to be intimately coated or wetted with the surfactant. This mixed concentrate is then mixed with water or some other liquid dispersing medium to the desired concentration. The working bath is preferably kept agitated during both the diluting and applying steps to aid in keeping the dispersion stable.

As stated above, the carbon black particles should have an average particle diameter below about 3 microns while in the dispersion. It is desirable to have this average particle diameter of carbon black as small as possible to obtain the desired plating characteristics of substantially even plating and no plating pullaways. It is preferred that the carbon black particles have an average particle diameter from about 0.1 to about 3.0, more preferably from 0.2 and about 2.0, microns when in said dispersion. The term "average particle diameter" as employed herein in both the specification and claims refers to average mean diameter of the particles (the average by number). The average mean diameter in the dispersion may be determined through the use of either a NiComp Model 270 submicron particle sizer (Version 3.0) or a HIAC PA-720 automatic particle size analyzer (both available from the HIAC/ROYCO Instrument Division of Pacific Scientific of Menlo Park, Calif.).

All types of carbon blacks may be used for this invention including the commonly available furnace blacks. However, it is preferred to utilize carbon blacks which are initially acidic or neutral, i.e. those which have a pH of between about 1 and about 7.5 and more preferably between about 2 and about 4 when slurried with water.

Carbon black particles of the preferred type contain between about 1 and about 10 percent by weight of volatiles and have an amorphous structure. In contrast, graphite particles used to plate through holes as mentioned in U.S. Pat. Nos. 3,099,608 and 3,163,588 are relatively pure carbon in crystalline form and have no effect on pH in an aqueous solution. When graphite particles are used as a replacement for the carbon black particles used with this invention, loss of adhesion of the copper to the non-conducting material after the subsequent electroplating was noted.

These preferred carbon black particles are also very porous and generally their surface areas are from between about 45 to about 1100, and preferably between about 300 and about 600, square meters per gram by the BET method (method of Brunauer-Emmett-Teller).

Illustrative carbon blacks suitable for use of this invention include Cabot XC-72R Conductive, Cabot Monarch 800, Cabot Monarch 1300, all manufactured by Cabot Corporation of Boston, Mass. Other suitable carbon blacks include Columbian T-10189, Columbian Conductex 975 Conductive, Columbian CC-40-220, and Columbian Raven 3500, all available from Columbian Carbon Company of New York, N.Y. Monarch 800 and Raven 3500 are the two most preferred carbon blacks because of their ease of dispersion and low pH.

The term "liquid dispersing medium" as used herein in the present specification and claims includes water and polar organic solvents (both protic and aprotic). Suitable protic polar organic solvents may include lower alcohols ($C_1$-$C_4$) such as methanol, ethanol, isopropanol and isobutanol; polyhydric alcohols such as glycols (i.e. triethylene glycols); ether-alcohols such as cellosolve; organic acids, such as formic acid and acetic acid; acid derivatives such as trichloroacetic acid; and sulfonic acids such as methane sulfonic acid. Suitable aprotic polar organic solvents include aldehydes such as acetaldehyde; ketones such as acetone; aprotic aromatic solvents such as toluene and mineral spirits; aprotic halogenated hydrocarbons such as dichlorofluoromethane and dichlorodifluoromethane (FREON); dimethylformamide (DMF); N-methylpyrrolidone; dimethylsulfoxide (DMSO); and esters of carboxylic acids such as methylformate, ethylacetate and cellosolve acetate. The preferred liquid dispersing medium is water because of cost and ease of use considerations. It is preferred to utilize deionized water which is free of lime, fluorine, iodine and other impurities normally found in tap water, in order to minimize interference of foreign ions during the subsequent electroplating step.

In addition to the water and carbon black, a third critical ingredient is needed in the dispersion, namely, a surfactant capable of dispersing said carbon black in said liquid dispersing medium (i.e. compatible with said carbon black and liquid dispersing medium). One or more of these is added to the dispersion in order to enhance the wetting ability and stability of the carbon black and permit maximum penetration by the carbon black within the pores and fibers of the non-conducting layer. Suitable wetting agents include anionic, nonionic and cationic surfactants (or combinations thereof such as amphoteric surfactants). The surfactants should be soluble, stable and preferably nonfoaming in the liquid carbon black dispersion. In general, for a polar continuous phase as in water, the surfactants should preferably have a high HLB number (8-18). The preferred type of surfactant will depend mainly on the pH of the dispersion. When the total dispersion is alkaline (i.e. has an overall pH in the basic range), it is preferred to employ an anionic or nonionic surfactant. Acceptable anionic surfactants include sodium or potassium salts of naphthalene sulfonic acid such as DARVAN No. 1 (R. T. Vanderbilt Co.), ECCOWET LF (Eastern Color and Chemical), PETRO AA, PETRO ULF (Petro Chemical Co., Inc.), and AEROSOL OT (American Cyanamid). Preferred anionic surfactants include neutralized phosphate ester-type surfactants such as MAPHOS 55, 56, 8135, 60A, L6 (Mazer Chemicals Inc.). The most preferable anionic surfactant for a liquid carbon black dispersion is MAPHOS 56. Suitable nonionic surfactants include ethoxylated nonyl phenols such as POLY-TERGENT B-series (Olin Corporation) or alkoxylated linear alcohols such as POLY-TERGENT SL-series (Olin Corporation).

The amount of carbon black in the dispersion should be less than about 4% by weight of the dispersion, preferably, less than about 2% by weight. It has been found that the use of higher concentrations of carbon blacks provide undesirable plating characteristics. In the same regard, the solids content (i.e. all of the ingredients other than the liquid dispersing medium) is preferably less than 10% by weight of the dispersion, more preferably, less than about 5.6% by weight.

The three above-noted critical components of the present invention, namely, the carbon black, liquid dispersing medium and surfactant, may be employed alone to form a liquid dispersion. In some situations, it may be desirable to add an alkaline hydroxide to this dispersion. Suitable alkaline hydroxide include alkali metal hydroxides such as potassium hydroxide, sodium hydroxide, and lithium hydroxide. Ammonium hydroxide or alkaline earth metal hydroxides such as calcium hydroxide may also be employed, if desired. Potassium hydroxide is the most preferred strong basic material. The term "alkaline hydroxide" is used throughout the description and claims to identify these strong basic materials used in both these steps and the pre-conditioning step. Sufficient alkaline hydroxide may be added to the liquid carbon black dispersion in a proportion sufficient to increase the pH of the resulting carbon black-containing dispersion to between about 9 and about 14, and preferably between about 9.5 and about 12.

Following is a typical formulation of a suitable aqueous alkaline dispersion of carbon black showing the general range of proportions as well as the preferred range of proportions for the various components:

| Component | General Range | Preferred Range |
|---|---|---|
| Carbon Black | 0.1–4% by wt. | 0.2–2% by wt. |
| Surfactant | 0.01–4% | 0.05–2% |
| Alkaline Hydroxide | 0–1% | 0.4–0.9% |
| Water | balance | balance |

The liquid dispersion of carbon black is typically placed in a suitable agitated vessel and the printed wiring board to be treated is immersed in, sprayed with or otherwise contacted with the liquid dispersion. The temperature of the liquid dispersion in an immersion bath is maintained in the range of between about 15° C. and about 35° C. and preferably between about 20° C. and about 30° C., while the pretreated printed wiring board is immersed therein. The period of immersion generally ranges from about 1 to about 10, and preferably from about 3 and about 5 minutes. During immersion, the liquid carbon black-containing dispersion penetrates the holes of the printed wiring board and wets and contacts the glass fiber as well as the epoxy resin which forms the components of the insulating layer. The immersed board is then removed from the bath of the liquid carbon black-containing dispersion.

The carbon black-covered board is then subjected to a step where substantially all (i.e. over about 95% by weight) of the water in the applied dispersion is removed and a dried deposit containing carbon black is left in the holes and on other exposed surfaces of the non-conducting layer. This may be accomplished by several methods such as by evaporation at room temperature, by a vacuum, or by heating the board for a short time at an elevated temperature, or by other equivalent means. Heating at an elevated temperature is the preferred method. Heating is generally carried out for between about 5 and about 45 minutes at a temperature of from about 75° C. to about 120° C., more preferably from about 80° C. to 98° C. To insure complete coverage of the hole walls, the procedure of immersing the board in the liquid carbon black dispersion and then drying may be repeated one or more times.

This drying step yields a board which may be completely coated with the carbon black dispersion. This dispersion is not only coated on the drilled hole surfaces, which is desirable, but also entirely coats the copper plate or foil surfaces which is undesirable. Thus prior to any photoimaging process all carbon black must be removed from the copper plate or foil surface.

The removal of the carbon black, specifically from the copper surfaces including, especially, the rims of the drilled holes while leaving the coating intact on the glass fibers and epoxy surface of the hole walls, may be preferably achieved by the employment of a mechanically scrubbing operation or a microetch or both. The microetch is preferred because of ease of use. One suitable sodium persulfate microetch is "BLACKHOLE MICROCLEAN 41" available from Olin Hunt Specialty Products, Inc. It is preferably combined with sufficient sulfuric acid to make a microetch bath containing 200 gm of sodium persulfate per liter and 0.5% by volume sulfuric acid. The mechanism by which this optional microetch works is by not attacking the carbon black material deposited on the copper foil directly, but rather to attack exclusively the first few atomic layers of copper directly below which provides the adhesion for the coating. Hence, the fully coated board is immersed in the microetch solution to "flake" off the carbon black from the copper surfaces into solution in the form of micro-flaklets. These micro-flakelets are removed from the microetch bath either by filtration through a pump or via a weir type filter arrangement commonly used in the PWB industry. The liquid carbon black dispersion, the optional microetch, and the subsequent optional water rinse are preferably carried out by immersing the PWB in a bath constructed of polypropylene or polyvinyl chloride (PVC) and kept agitated by a recirculation pump or pumped in air.

In the case of a multilayer type board this microetching step is especially preferred. Since, after the drying step, not only will the outer copper plate or foil be coated with carbon black but also the copper inner plates or foils exposed within the holes. Thus, this microetch procedure performs three very desirable tasks at once:

A. It removes substantially all excess carbon black material adhering to the outer copper plates or foils and the exposed surfaces of copper inner plates or foils in a multilayer PWB.

B. It chemically cleans and microetches slightly the outer copper surfaces, thereby making them good bases for either dry film application or the electrolytic deposition of copper when followed by mechanically scrubbing the PWB.

After the optional microetch step and subsequent optional water rinse, the PWB may now either proceed to the photoimaging process and later be electroplated or be directly panel electroplated.

The thus treated printed wiring board is then immersed in a suitable electroplating bath for applying a copper coating on the hole walls of the non-conducting layer.

The present invention contemplates the use of any and all electroplating operations conventionally employed in applying a metal layer to the through hole walls of a PWB. Therefore this claimed invention should not be limited to any particular electroplating bath parameters.

A typical copper electroplating bath is comprised of the following components in the following proportions:

| Component | General Proportions | Preferred Proportions |
|---|---|---|
| Copper (as metal) | 1.25–2.5 oz/gal | 1.5–2.25 oz/gal |
| Copper Sulfate | 5–10 oz/gal | 6–9 oz/gal |
| 98% Concentrate $H_2SO_4$ (by weight) | 23–32 oz/gal | 27–30 oz/gal |
| Chloride Ion | 20–100 mg/l | 40–60 mg/l |

The electroplating bath is normally agitated and preferably maintained at a temperature of between about 20° C. and about 25° C. The electroplating bath is provided with anodes, generally constructed of copper, and the printed wiring board to be plated is connected as a cathode to the electroplating circuit. For example, a current of about 15 amps per square foot is impressed across the electroplating circuit for a period of between about 60 and about 90 minutes in order to effect copper plating on the hole walls of the non-conducting layer positioned between the two plates of copper up to a thickness of about 1 mil±0.2 mil. This copper plating of the hole wall provided a current path between the copper layers of the printed wiring board. Other suitable electroplating conditions may be employed, if desired. Other electroplating bath compositions containing other copper salts or other metal salts such as salts of nickel, gold, palladium, silver and the like may be employed, if desired.

The printed wiring board is removed from the copper electroplating bath and then washed and dried to provide a board which is further processed by applying photoresist compounds and the like, as is known in the art for the preparation of printed wiring boards.

It has been found that, even with excess dwell time in the liquid carbon black bath, the resulting carbon black coating does not appreciably increase in thickness. This seems to mean that this is a surface adsorption process and once coverage is attained over the entire surface of the hole profile, no more build up of material will take place.

The following examples are presented to define the invention more fully without any intention of being limited thereby. All parts and percentages are by weight unless otherwise explicitly specified.

Printed Wiring Board Specifications

Two types of laminated printed wiring board (PWB) were treated in the Examples 1–4 below. One type is the double-sided PWB which comprised two 35 micron thick copper outer plates which sandwiched a 1.55 mm thick epoxy resin/fiberglass inner layer. The second type was a multilayer PWB which comprised four 35 micron thick copper plates alternating with three epoxy resin/fiberglass layers. Both types of PWB as used in Examples 1–4 were about 15 centimeters wide and about 23 centimeters in length and had about 300 to 400 through holes, ranging from about 1.0 millimeters to about 4.0 millimeters in diameter drilled through all of the layers of each PWB.

EXAMPLE 1

Many a double-sided and a multilayer printed wiring boards as described above first had their surfaces mechanical scrubbed. The multilayer boards were also then subjected to a conventional potassium permanganate desmearing operation. Then both types of boards were prepared for copper electroplating their through holes by immersion in the following sequence of aqueous baths (each about 28 liters in volume) for the indicated time and temperatures (if no temperature recited, then at room temperature):

Bath 1. Silicate-containing cleaner formulation (5 minutes at 140° F.)
Bath 2. Tap Water Rinse (2 minutes)
Bath 3. Conditioner Formulation (4 minutes)
Bath 4. Tap Water Rinse (2 minutes)
Bath 5. Carbon Black Pre-plating Dispersion (4 minutes)
[Then dry PWB at 93° C. (20 minutes)]
Bath 6. Sodium Persulfate Microetch (2 minutes)
Bath 7. Tap Water Rinse (1 minute)

Bath 1 is an aqueous solution containing a PWB cleaner formulation comprising the following:

| Ingredient | Quantity |
| --- | --- |
| monoethanolamine | 10.75 g/l |
| ethoxylate-type nonionic surfactant[1] | 5.70 g/l |
| ethylene glycol | 1.00 g/l |
| KOH[2] | 1.70 g/l |
| fumed silica[3] | 0.91 g/l |
| deionized water | balance |

[1] NEODOL 91-8 available from Shell Oil Co. of Houston, Texas
[2] Solid potassium hydroxide pellets (86% by weight KOH, 14% by weight $H_2O$)
[3] CAB-O-SIL MS-75D available from the Cabot Corporation, Boston, Massachusetts The fumed silica and KOH were pre-mixed with a portion of the deionized water to make an aqueous potassium silicate solution which was then added to ingredients of the cleaner formulation.

Bath 3 was an aqueous conditioner formulation[4] containing the following:

| Ingredient | Quantity |
| --- | --- |
| polyamide amine resin[5] | 0.10 g/l |
| monoethanolamine | 10.75 g/l |
| deionized water | balance |

Bath 5 is a room temperature deionized water bath containing the carbon black pre-plating formulation. In this bath, the proportions of each ingredient were as follows:

| | |
| --- | --- |
| 0.11% by weight anionic surfactant[6] | |
| 0.83% by weight KOH[2] | |
| 0.37% by weight carbon black[7] | |
| 1.31% by weight total solids | |

The balance of the bath was deionized water.

[4] Conditioner 102 available from Olin Hunt Specialty Products, Inc., West Paterson, New Jersey
[5] SANDOLEC CF polyamide amine resin made by Sandoz Chemicals, Charlotte, North Carolina
[6] MAPHOS 56 an anionic surfactant produced by Mazer Chemicals Inc. of Gurnee, Illinois (90% by weight surfactant, 10% by weight $H_2O$)
[7] Raven 3500 carbon black produced by Cabot Corporation This carbon black dispersion of Bath 5 was prepared by milling a concentrated form of this dispersion in a pebble mill containing stone pebbles so that the concentration of pebbles occupied about one third of the mill volume. The surfactant was dissolved in deionized water/KOH to give a continuous phase. Then the carbon black was added. Milling time was six hours. After milling, the concentrate was diluted with sufficient deionized water to make the dispersion in the above-indicated proportions.

After Bath 5, the board was placed in a hot air recirculatory oven and heated to 93° C. for 20 minutes. This drying step removed the water from the carbon black coating on the board, thereby leaving a dried deposit of carbon black all over the board and in the through holes of the board. The drying promotes adhesion between the carbon black and the non-conductive surfaces of the board.

Bath 6 was a room temperature aqueous bath and contained 200 grams of sodium persulfate per liter of deionized water and 0.5% by volume of concentrated $H_2SO_4$. Its function was to microetch the copper surfaces of the board so as to remove the deposited carbon black from the surfaces. It does not act on the epoxy/glass surfaces. This sodium persulfate/$H_2SO_4$ microetch was made from "BLACKHOLE MICROCLEAN 41" which is available from Olin Hunt Specialty Products, Inc. of West Paterson, N.J.

Rinse baths 2 and 4 and 7 were employed to prevent the carryover of chemicals from one treatment bath in the next.

After treatment with this sequence of baths, the circuit board was mechanically scrubbed in a Chemcut Surface Cleaner/Finisher, Model No. 107I available from Chemcut Co., of State College, Pa. to remove any residual deposited carbon black dispersion on the outer copper surfaces of the board. An aqueous dry film resist was then laminated onto both sides of the panel, the panel was exposed, developed and rinsed with cold tap water. The panels were then placed in an acid cleaner for two minutes, followed by a cold tap water rinse for two minutes, a sodium persulfate microetch (MICROCLEAN 41) for 15 seconds and again rinsed for two minutes in tap water. The panels were then placed in a sulphuric acid, 10% bath for two minutes and then placed in an electroplating bath provided with agitation means and which contained an electrolyte bath comprised of the following:

| Plating Bath Compositions | |
| --- | --- |
| Component | Proportion |
| Copper Sulfate | 6.2 oz./gal. |
| Conc. $H_2SO_4$ (98% by weight) | 30 oz./gal |
| Chloride Ion | 40 mg/l |

The printed wiring board was connected as a cathode in the electroplating vessel having a volume of about 45 liters. Two copper bars were immersed in the electrolyte and connected to the cell circuits as anodes. The copper bars had a length of about 23 cm; a width of about 9 cm and a thickness of about 4 cm. Each face was about 207 square cm. A direct current of 30 amps per square foot was impressed across the electrodes in the electroplating bath for approximately 45 minutes. The bath was maintained at a temperature of about 25° C. during this period and agitation was effected by air sparging. At the end of this period, the circuit board was disconnected from the electroplating circuit removed from the electrolyte, washed with tap water and dried.

A close examination of the majority of electroplated boards showed some small unplated areas (voids) on glass portions of the hole walls of many boards when electroplated to a thickness of 1.0 mil±0.2 mil. A minority of the examined plated boards showed acceptable void-free plating. No "dog boning" was observed on any boards (i.e., this latter effect is an undesirable condition where the plated layer is thicker near the copper laminate areas of the PWB). In a standard adhesion test[8], there was no removal of the electroplated copper from the hole walls of the epoxy/glass fiber layer component. It is believed that the undesirable voids were caused by the strong nonionic surfactant used in the cleaner solution. This cleaner was difficult to fully rinse off and may have left a residue which may have interfered with the silicate solution and conditioner solution.

[8] IPC Test No. 2.6.8s "Thermal Stress Methodology via Solder Float Test" generally referred to as the standard solder shock test.

EXAMPLE 2

Hundreds of double-sided and multilayer printed wiring boards as described above were subjected to the same pre-plating treatment and plating procedure as set forth in Example 1 except that the silicate-containing cleaner bath (Bath 1) was an aqueous solution comprising the following:

| Ingredient | Quantity |
| --- | --- |
| sodium hydroxide | 60.0 g/l |
| sodium metaborate | 5.0 g/l |
| sodium sulfate decahydrate | 5.0 g/l |
| alkyl naphthalene sodium sulfonate anionic surfactant[9] | 1.0 g/l |
| KOH[2] | 1.7 g/l |
| fumed silica[3] | 0.91 g/l |
| deionized water | balance |

The fumed silica and KOH were again premixed in a portion of the deionized water to make an aqueous potassium silicate solution which was then added to the ingredients of the cleaner formulation.

An examination of many of the resulting electroplated boards showed that the hole walls were coated with a relatively uniform layer of copper (1.0 mil±0.2 mil) and no voids on glass epoxy or no "dog boning" was observed on any of the boards (i.e., this latter effect is an undesirable condition where the plated layer is thicker near the copper laminate areas of the PWB). In a standard adhesion test[8] on many of these boards there was no removal of the electroplated copper from the hole walls of the epoxy/glass fiber layer component.

[9] Petro AA alkyl naphthalene sodium sulfonate anionic surfactant available from Petrochemicals Co., Inc. of Fort Worth, Texas

EXAMPLE 3

Hundreds of double-sided and multilayer printed wiring boards as described above were subjected to the same pre-plating treatment and plating procedure as set forth in Example 1 except that the boards were subjected to the following sequence of aqueous pre-plating baths:
Bath 1. Cleaner Formulation (5 minutes at 145±5° F.)
Bath 2. Tap Water Rinse (2 minutes)
Bath 3. Silicate Solution (4 minutes)
Bath 4. Tap Water Rinse (2 minutes)
Bath 5. Conditioner Formulation (4 minutes)
Bath 6. Tap Water Rinse (2 minutes)
Bath 7. Carbon Black Pre-plating Dispersion (4 minutes)
[Then Dry PWB at 90° C. (20 minutes)]
Bath 8. Sodium Persulfate Microetch (2 minutes)
Bath 9. Tap Water Rinse (2 minutes)

Bath 1 was a heated aqueous cleaner solution[10] containing the following PWB cleaner formulation:

| Ingredient | Quantity |
| --- | --- |
| monoethanolamine | 10.75 g/l |
| ethoxylate-type nonionic surfactant[1] | 5.70 g/l |
| ethylene glycol | 1.0 g/l |
| deionized water | balance |

[10] Cleaner 102 available from Olin Hunt Specialty Products, Inc. of West Paterson, New Jersey Bath 3 was a room temperature aqueous potassium silicate bath which was made by adding 1.7 g/l KOH[2] and 0.91 g/l of fumed silica[3] into the deionized water.

Baths 5, 7 and 8 are the same as Baths 3, 5 and 6, respectively, in Example 1.

An examination of many resulting electroplated boards showed that the hole walls were coated with a relatively uniform layer of copper (1.0 mil±0.2 mil) and again no voids on glass or epoxy or no "dog boning" was observed on any boards (i.e., this latter effect is an undesirable condition where the plated layer is thicker near the copper laminate areas of the PWB). In a standard adhesion test[8] on many boards there was no removal of the electroplated copper from the hole walls of the epoxy/glass fiber layer component. Example 3 gave the same results as Example 2 but it is a longer process, therefore the process of Example 2 is preferred.

EXAMPLE 4

Same as Example 3 except the silicate solution is after the conditioner solution as follows:
Bath 1. Cleaner Solution (5 minutes at 145±5° F.)
Bath 2. Tap Water Rinse (2 minutes)
Bath 3. Conditioner Solution (4 minutes)
Bath 4. Tap Water Rinse (2 minutes)
Bath 5. Silicate Solution (4 minutes)
Bath 6. Tap Water Rinse (2 minutes)
Bath 7. Carbon Black Pre-plating Dispersion (4 minutes)
[Dry at 90° C. (20 minutes)]
Bath 8. Sodium Persulfate Microetch (2 minutes)
Bath 9. Tap Water Rinse (2 minutes)

An examination of many of the resulting electroplated boards showed some unplated areas (voids) when electroplated to a thickness of 1.0 mil±0.2 mil. No "dog boning" was observed (i.e., this latter effect is an undesirable condition where the plated layer is thicker near the copper laminate areas of the PWB). In a standard adhesion test[8], there was no removal of the electroplated copper from the hole walls of the epoxy/glass fiber layer component. It is not completely clear why the voids occurred with this process, however, it is believed the use of the silicate solution after the conditioner solution may have interfered with desired functions of the conditioner. This has not yet been proven.

EXAMPLE 5

Smaller double-sided and multilayer printed wiring boards (10 cm wide by 15 cm long with about 100–200 holes of about the same diameters and thicknesses as those in Examples 1–4) were treated to the same procedure set forth in Example 2 except that the baths were 4 liter beakers and conditioner Bath 3[11] contains the following ingredients:

| Ingredient | Quantity |
| --- | --- |
| stearamidopropyldimethyl-hydroxyethylammonium-dihydrogen phosphate[12] | 3.0 g/l |
| triethanolamine | 33.0 g/l |
| deionized water | balance |

An examination of the resulting electroplated board showed that the hole walls were coated with a relatively uniform layer of copper (1.0 mil±0.2 mil) and no voids for glass and epoxy or "dog boning" was observed (i.e., this latter effect is an undesirable condition where the plated layer is thicker near the copper laminate areas of the PWB). In a standard adhesion test[8], there was no removal of the electroplated copper from the hole walls of the epoxy/glass fiber layer component. The process of this Example appears to give the same results as the most preferred process shown in Example 2.

[11] Conditioner 103 available from Olin Hunt Specialty Products, Inc. of West Paterson, New Jersey
[12] CYASTAT SP Antistatic Agent available from American Cyanamid Co. of Wayne, New Jersey

What is claimed is:
1. A process for electroplating the walls of through holes in a laminated printed wiring board comprised of at least one non-conducting layer laminated to at least two separate conductive metal layers, which comprises the steps:
 (a) contacting said printed wiring board with an aqueous alkaline silicate solution, followed by;
 (b) contacting said printed wiring board with a dispersion of carbon black comprising:
  (1) carbon black particles having an average particle size of less than about 3.0 microns in said dispersion;
  (2) an effective dispersing amount of a surfactant which is compatible with said carbon black; and
  (3) a liquid dispersing medium, wherein the amount of carbon black is sufficient to coat substantially all of the non-conducting portions of said hole walls and is less than about 4% by weight of said liquid dispersion; then
 (c) separating substantially all of the liquid dispersing medium from said dispersion, thereby depositing said carbon black particles in a substantially continuous layer on said non-conducting portions of said hole walls; and
 (d) electroplating a substantially continuous metal layer over the deposited carbon black layer on said non-conducting portions of hole walls, thereby electrically connecting said metal layers of said printed wiring board.

2. The process of claim 1 wherein said contacting step (a) is carried out by immersing the printed wiring board in an aqueous bath containing said alkaline silicate.

3. The process of claim 2 wherein said alkaline silicate solution is made in situ by the reaction of an alkaline hydroxide and fumed silica.

4. The process of claim 3 wherein the amount of said alkaline silicate is from about 0.5 to about 2.0% by weight of said aqueous bath.

5. The process of claim 4 wherein said contacting step (a) occurs at a temperature from about 20° C. to about 70° C.

6. The process of claim 1 wherein contacting step (a) is preceded by, or concurrently carried out with, a contacting step with a cleaner solution.

7. The process of claim 6 wherein said cleaner solution comprises a surfactant and an alkaline compound selected from the group consisting of amines and hydroxides.

8. The process of claim 1 wherein said printed wiring board is contacted with an aqueous conditioning solution between steps (a) and (b).

9. The process of claim 8 wherein said conditioning solution comprises the mixture of monoethanolamine and a polyamine resin in water.

10. The process of claim 8 wherein said conditioning solution comprises a mixture of stearamidopropyldimethylhydroxyethylammonium-dihydrogen phosphate and triethanolamine in water.

11. The process of claim 1 wherein said carbon black particles have an initial pH from about 2 to about 4.

12. The process of claim 1 wherein said surfactant is a phosphate ester anionic surfactant.

13. The process of claim 1 wherein said liquid dispersing medium is water.

14. The process of claim 1 wherein said liquid dispersion further comprises a sufficient amount of at least one alkaline hydroxide to raise the pH of said liquid dispersion to about 9 to about 14.

15. The process of claim 14 wherein said alkaline hydroxide is selected from the group consisting of potassium hydroxide, sodium hydroxide and ammonium hydroxide.

16. The process of claim 1 wherein said liquid dispersion contains less than about 10% by weight solids constituents.

17. The process of claim 1 wherein said conductive metal is copper.

18. The process of claim 1 wherein said process further comprises microetching said metal layers of said printed wiring board after step (c) and before step (d) to remove any deposited carbon black therefrom.

19. The process of claim 18 wherein said process further comprises a water rinse after said microetching.

20. A process for electroplating the walls of through holes in a laminated printed wiring board comprised of at least one non-conducting layer laminated to at least two separate conductive metal layers, which comprises the steps:
 (a) contacting said printed wiring board with a combined aqueous cleaner and alkaline silicate solution;
 (b) contacting said cleaned and silicate-treated printed wiring board with an aqueous conditioner solution;
 (c) contacting said printed wiring board with a liquid dispersion of carbon black comprising:
  (1) carbon black particles having an average particle size of less than about 3.0 microns in said dispersion;
  (2) an effective dispersing amount of a surfactant which is compatible with said carbon black;
  (3) a sufficient amount of at least one alkaline hydroxide to raise the pH of said liquid dispersion to about 9.5 to about 12; and
  (4) a liquid dispersing medium, wherein the amount of carbon black is sufficient to coat substantially all of the non-conducting portions of said hole walls and is less than about 4% by weight of said liquid dispersion; then
 (d) separating substantially all of the liquid dispersing medium from said dispersion, thereby depositing said carbon black particles in a substantially continuous layer on said non-conducting portions of said hole walls; and
 (e) microetching said metal layers of printed wiring board to remove any deposited carbon black therefrom; and
 (f) electroplating a substantially continuous metal layer over the deposited carbon black layer on said non-conducting portions of hole walls, thereby electrically connecting said metal layers of said printed wiring board.

21. The process of claim 20 wherein said surfactant is a phosphate ester anionic surfactant, said alkaline hydroxide is potassium hydroxide and said liquid dispersing medium is water.

22. A printed wiring board having at least one through hole, the walls of said through hole contacted with an aqueous alkaline silicate solution and then having a substantially continuous layer of carbon black having an average particle size of less than about 3.0 microns and a surfactant deposited on the non-conductive portions of said through hole.

23. The printed wiring board of claim 22 wherein said surfactant is a phosphate ester anionic surfactant 24. The printed wiring board of claim 22 wherein said continuous layer of carbon black and surfactant additionally contains an alkaline hydroxide.

25. A printed wiring board having at least one metal-plated through hole, the walls of said metal-plated through hole contacted with an aqueous alkaline silicate solution and then having a substantially continuous layer of carbon black having an average particle size of less than about 3.0 microns and a surfactant deposited on the non-conductive portions of said through hole and underlying the plated on metal.

26. The printed wiring board of claim 25 wherein said surfactant is a phosphate ester anionic surfactant.

27. The printed wiring board of claim 25 wherein said continuous layer of carbon black and surfactant additionally contains an alkaline hydroxide.

28. The printed wiring board of claim 25 wherein said metal is copper.

* * * * *